United States Patent [19]

Miller

[11] 4,366,547
[45] Dec. 28, 1982

[54] DIGITAL FILTER WITH SCALED TAP COEFFICIENTS

[75] Inventor: Charles K. Miller, Concord, Mass.

[73] Assignee: Codex Corporation, Mansfield, Mass.

[21] Appl. No.: 188,536

[22] Filed: Sep. 18, 1980

[51] Int. Cl.$^3$ .............................................. G06F 15/31
[52] U.S. Cl. .............................................. 364/724
[58] Field of Search ....................................... 364/724

[56] References Cited

U.S. PATENT DOCUMENTS

| | | | |
|---|---|---|---|
| 3,955,193 | 5/1976 | Koffler et al. | 364/724 X |
| 3,967,102 | 6/1976 | McCown | 364/724 |
| 4,044,241 | 8/1977 | Hatley, Jr. | 364/724 |
| 4,184,129 | 1/1980 | Danjon et al. | 364/724 X |
| 4,290,139 | 9/1981 | Walsh | 364/724 X |

OTHER PUBLICATIONS

Riso et al., "Digital Filter, Scaling", *IBM Tech. Disclosure Bulletin*, vol. 16, No. 1, Jun. 1973, pp. 235–236.
Bywater et al., "A Real-Time Non-Recursive Digital Filter", *Int. J. Electronics*, vol. 45, No. 3, Sep. 1978, pp. 265–271.

*Primary Examiner*—David H. Malzahn

[57] ABSTRACT

Modem circuitry for processing data signals, featuring a digital filter whose tap coefficients are all scaled by a common factor such that the most significant bits of the filter output are indicative of the digital data.

5 Claims, 11 Drawing Figures

4,366,547

DIGITAL FILTER WITH SCALED TAP COEFFICIENTS

BACKGROUND OF THE INVENTION

This invention relates to digital filtering of data modulated electrical signals in modems.

Digital filters, wherein the signal value is sampled at a high rate and the resultant samples are arithmetically processed to yield a filter output, are often used to fulfill the various modem filtering requirements. This is particularly true of transversal digital filters where a predetermined number of the most recent samples are stored, e.g., as in a delay line which defines the time span of the filter. Following the taking of each new sample and its entry into the delay line, each of the samples currently stored is multiplied by a tap coefficient, there being one tap coefficient associated with each unit of the delay line. The sum of all such multiplications yields the filter output.

The digital data which has been encoded, by modulation of the carrier signal in the transmitting modem, is commonly recaptured, in the receiving modem, through a decision making process, usually after filtering of the received signal. Typically, the decision to be made is whether the signal characteristic which has been modulated, be it amplitude, phase or frequency, is greater or less than a decision threshold.

SUMMARY OF THE INVENTION

The invention features improved digital filter circuitry, whose filtered output is particularly adapted for decision thresholding. In general, there is provided means for sampling a signal representative of digital data, means for storing a predetermined number of the samples, means for storing a plurality of tap coefficients, and means for producing the sum of the products of samples and tap coefficients to produce a filter output, wherein the tap coefficients are scaled by a common factor such that the most significant bit of the filter output is indicative of the digital data. In a preferred embodiment there is further provided means for comparing the filter output to a predetermined threshold value, the filter output and threshold value both being powers of two.

DESCRIPTION OF THE PREFERRED EMBODIMENT

We turn now to a description of the preferred embodiment, after first briefly describing the drawings.

EMBODIMENTS

Figure 1:
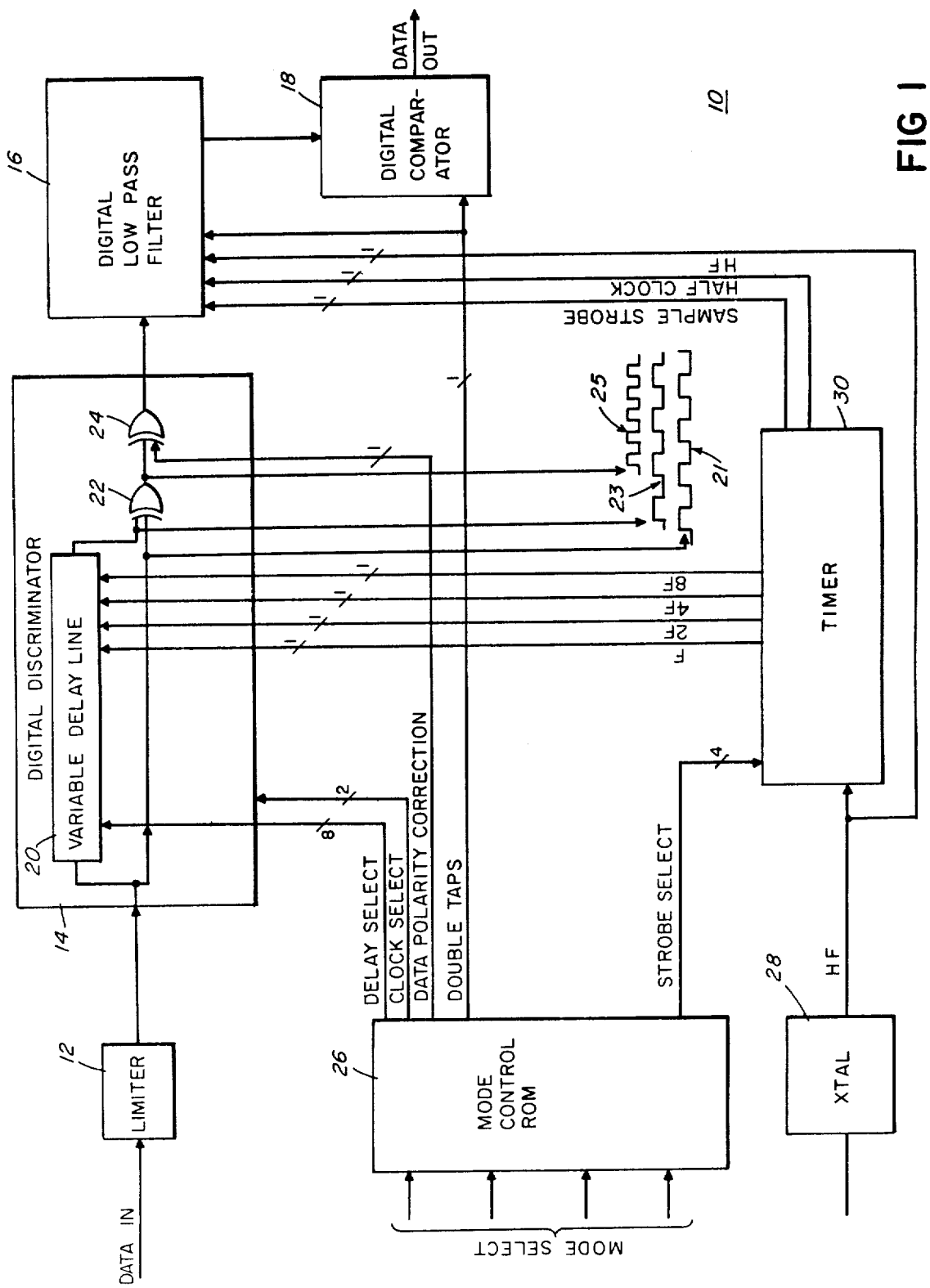
FIG. 1 is a block diagram of a digital demodulator for frequency shift keyed (FSK) data communications signals.

Referring now to FIG. 1, demodulator 10 has four digital components through which a received two-level frequency modulated carrier signal sequentially passes: a hard limiter 12, a digital discriminator 14, a digital low pass filter 16, and a digital comparator 18.

Hard limiter 12 limits the received time waveform to produce a clipped, nearly square waveform of the same frequency and phase as the received frequency modulated carrier signal.

The clipped waveform passes to discriminator 14 consisting of a variable length digital delay line 20 and EXCLUSIVE OR gates 22 and 24. Within discriminator 14, the clipped waveform is split into two separate streams. One stream passes directly to gate 22 while the other stream passes through delay line 20 which induces a time delay in its passage of $$t = \frac{(2n + 1)}{2f_c},$$

where $$f_c = \frac{f\text{mark} + f\text{space}}{2},$$

n is an integer, and fmark and fspace are respectively the mark and space frequencies for the data communications protocol according to which the carrier signal is modulated. The output of delay line 20 passes to gate 22 where it is exclusive ored with its undelayed counterpart.

Waveforms 21, 23 and 25 illustrate the relationships which will exist among the output of limiter 12, the output of delay line 20 and the output of gate 22, respectively, if the received signal is of frequency $f_c$. Since delay induced by delay line 20 is an odd number of quarter periods of $f_c$, waveform 21 will lead waveform 23 by 90°. The output of gate 22 will then be a 50/50 duty cycle, of frequency $2f_c$ whose high going excursions are of equal durations as its low going excursions. As explained more fully below, discriminator 14 is capable of demodulating a great variety of FSK signals, due in part, to the fact that the total time delay asserted by delay line 20 may be easily varied over a wide range. Depending on the communications protocol being followed, either fmark or fspace might be the higher frequency. Additionally, the specific values used for fmark and fspace are varied, depending on the user. The flexibility of variable delay line 20, however, assures that, for all commonly used FSK schemes, the time delay line 20 may be chosen such that the output of gate 22 will be mostly high during reception of one of the two signaling frequencies and mostly low during reception of the other signalling frequency. In fact, there may well be more than one delay time which will cause this condition. Of course, delay times longer than the symbol interval are ruled out.

If the received signal is of any other frequency between fmark and fspace inclusive, other than fc, then the output of gate 22 will have a frequency double that of the received signal and the duty cycle will depart from 50/50 in proportion to the difference between the frequency of the received signal and $f_c$.

In certain situations, protocol being used may dictate that fmark is high, and yet the optimum time delay chosen may cause the output of gate 22 to be mostly low during reception of fmark. To allow for operation under this and other similar circumstances, there is provided an exclusive or gate 24.

The output of gate 22 passes to gate 24 which has, as another input, A DATA POLARITY CORRECTION signal. If DATA POLARITY CORRECTION is non-active, then the output of gate 24 is identical to the output of gate 22. If, on the other hand, DATA POLARITY CORRECTION is active, the output of gate 24 is the negation of the output of gate 22. The inclusion of gate 24 gives demodulator 10 universal compatability with various communication protocols, since, as described below, the DATA POLARITY CORRECTION signal may be selectively activated by a read only memory element.

The output of gate 24 passes to filter 16 which removes the $f_c$ and $2f_c$ frequency components. The output of filter 16, the recovered baseband signal, passes to comparator 18 which compares the signal to a threshold decision level and provides, as output (DATA OUT), a mark or space as appropriate.

A Mode Control Read Only Memory (ROM) 26, responsive to the configuration of a 4 bit MODE SELECT signal, provides the following control signals to various components of demodulator 10. DELAY SELECT is an 8 bit control signal which determines the length of delay line 20. CLOCK SELECT is a 2 bit control signal which determines the speed with which the signal moves through delay line 20. The DATA POLARITY CORRECTION control signal has been discussed above. DOUBLE TAPS is a 1 bit control signal which determines the resolution of filter 16 and is discussed in detail below. STROBE SELECT, a 4 bit control signal, determines the sampling frequency of filter 16.

A high frequency crystal oscillator 28 generates a high frequency clock (HF) which is provided to a timer circuit 30 and filter 16. Timer 30 divides the frequency of HF by two to obtain a HALF CLOCK signal which it provides to filter 16. The frequency of HALF CLOCK is further divided down by circuit 30 to produce F, 2F, 4F, and 8F, timing signals which are supplied to discriminator 14 and which are of a greatly reduced frequency as compared to HALF CLOCK.

The frequencies of F, 2F, 4F, and 8F are 1, 2, 4 and 8 times a fundamental frequency F. The CLOCK SELECT control signal selects one of them as the shifting frequency of the signal through the digital logic of delay line 20. Since the length of delay line 20 is selectable via the DELAY SELECT control signal and the shifting frequency of delay line 20 is selectable via the CLOCK SELECT control signal, the amount of signal delay (in seconds) induced by delay line 20 is determined by the status of these two control signals.

Circuit 30, also generates a SAMPLE STROBE signal for filter 16, the timing of SAMPLE STROBE depending upon the value of the 4 bit STROBE SELECT control signal. When SAMPLE STROBE is active, the signal value existing at the output of gate 24 is "strobed" into the digital logic of filter 16.

The control signals DELAY SELECT, CLOCK SELECT, DATA POLARITY CORRECTION, DOUBLE TAPS and STROBE SELECT may be fully static signals. Their values determine the particular frequencies, fmark and fspace, and the bit rate, in bits per second, which demodulator 10 is currently operable. ROM 26 contains, at various addresses, the control signal values for many commonly used frequency allocations and bit rates as well as for specialized applications. Thus, by simply changing from one address to another, demodulator 10 may be made to operate under different protocols. It is evident that another ROM 26 could be programmed for applications which are not now provided for.

Figure 2:
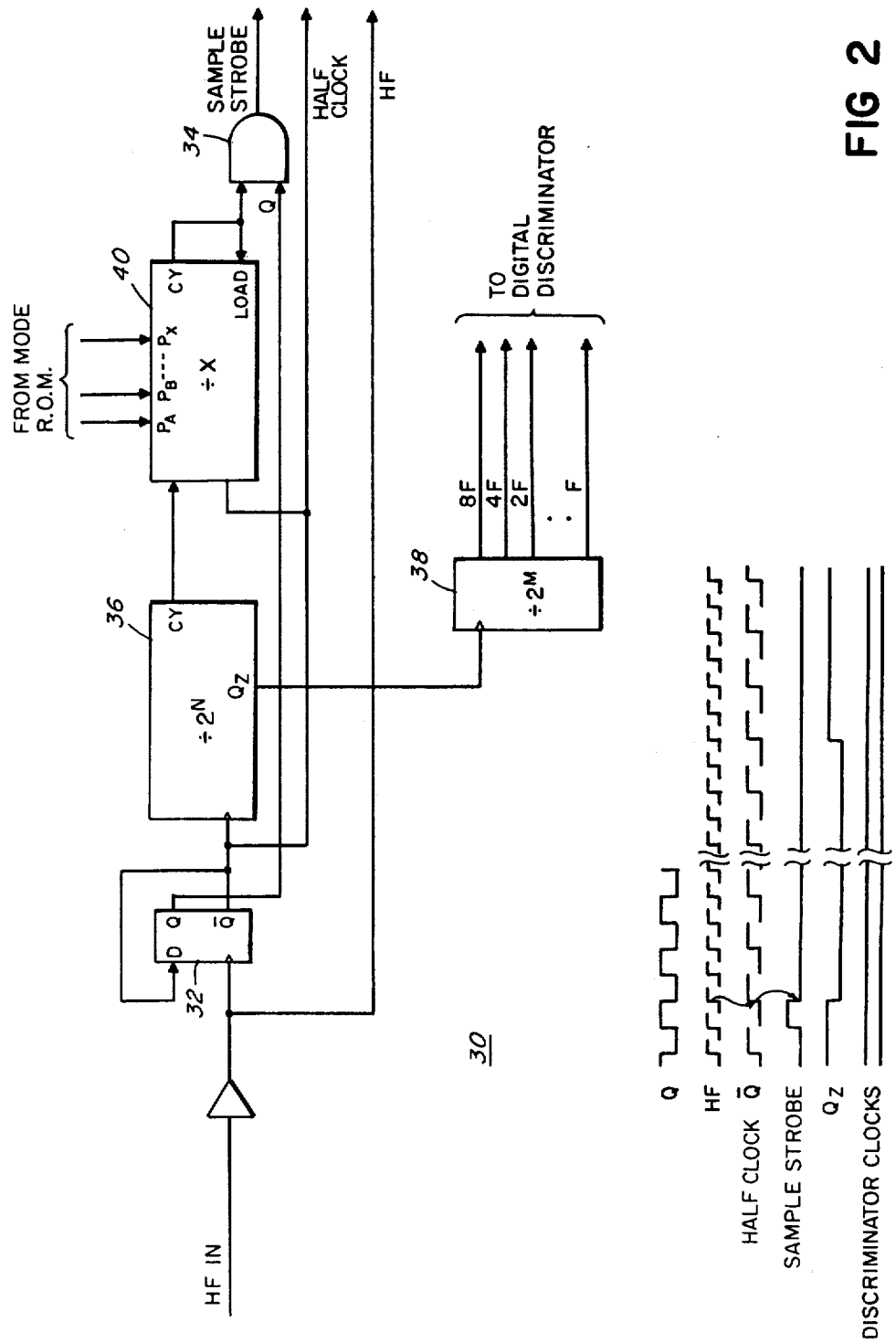
FIG. 2 is a schematic of the timing circuit and timing relationships of the demodulator of FIG. 1.

Referring now to FIG. 2, timer 30 has a flipflop 32, an AND gate 34, and binary up-counters 36 and 38 and 40. Flipflop 32 is connected so as to divide the frequency of HF by two, to produce the signal HALF CLOCK which, besides being provided as an output of circuit 30, is supplied as an input to counter 36. Counter 36 divides the frequency of HALF CLOCK by $2^N$, producing signal $Q_z$ which is provided as input to counter 38. Counter 38 is tapped at four of its stages to produce the signals F, 2F, 4F and 8F, the shift timing signals for delay line 20.

A carry signal from counter 36 enables counter 40 whose other input is HALF CLOCK. Counter 40 counts X times $2^N$ cycles of HALF CLOCK, where X is determined by the value of the STROBE SELECT control signal, whereupon it enables gate 34. Signal Q is of equal frequency but 180° out of phase with HALF CLOCK. With gate 34 enabled, the next rise of Q will cause SAMPLE STROBE to go active.

Figure 3:
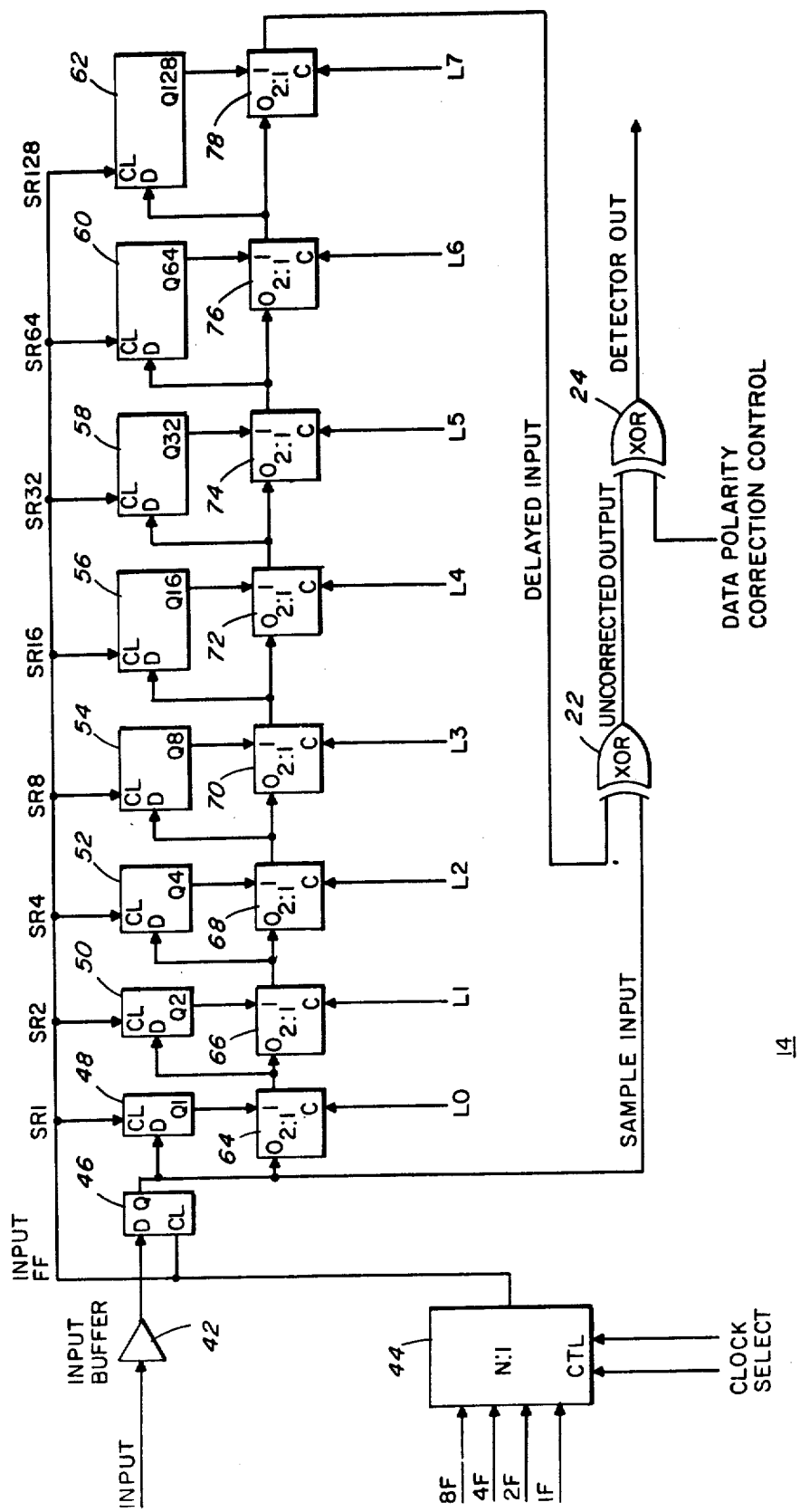
FIG. 3 is a schematic of the digital discriminator of the demodulator of FIG. 1.

Referring now to FIG. 3, discriminator 14 consists of a digital buffer 42; a 1 of 4 multiplexer 44; a flipflop 46; shift registers 48 to 62 (SR1 to SR128); 1 of 2 multiplexers 64 to 78; gate 22; and gate 24.

The length of each of shift registers 48 to 62 (i.e., the number of stages or flipflops making up each shift register) is $2^N$, for N=1, 2 ... 8, where N is the position of the shift register on FIG. 3, counting from left to right. For example, shift register 48 is one stage in length, shift register 50 is two stages in length, shift register 52 is four stages in length, and so on.

Multiplexer 44 supplies a DELAY SHIFT CLOCK signal which, dependent upon the value of the two bit CLOCK SELECT control signal, is either F, 2F, 4F or 8F. DELAY SHIFT CLOCK, the shifting clock for each of shift registers 48 to 62, also serves as a gating clock for flipflop 46, which gates the hard limited data signal from buffer 42 to shift registers 48 to 62.

Each of shift registers 48 to 62 has an associated 1 of 2 multiplexer 64 to 78 (e.g., multiplexer 66 is associated with shift register 50). One of the data inputs to each of multiplexers 64 to 78 is the output, if any, of the preceeding multiplexer. The other data input to each of multiplexers 64 to 78 is the output of its associated shift register. The data output of each of multiplexers 64 to 78 is provided as input to both the succeeding multiplexer and the succeeding shift register. (One of the data inputs to multiplexer 64 is the output of flipflop 46 and the output of multiplexer 78 is provided directly to gate 22.)

Signals L0 to L7 are the 8 bits of the DELAY SELECT control signal. If the 1 bit of the DELAY SELECT control signal provided to one of multiplexers 64 to 78 is active, that multiplexer provides, as output, the output of its associated shift register. If the 1 bit DELAY SELECT signal for that multiplexer is inactive, the multiplexer provides, as output, the output of the previous multiplexer, thereby effectively "short circuiting" its associated shift register.

The maximum number of delay units which may be activated in the delay line 20, consisting of shift registers 48 to 62 and multiplexers 64 to 78, is 255, corresponding to all 8 bits of the DELAY SELECT control signal being active. In general, since the lengths of shift registers 48 to 62 form a binary power expansion, any number of delay units, from 0 to 255 inclusive may be inserted.

The delay, in seconds, is given by the number of shift register stages asserted in the chain divided by the frequency of the DELAY SHIFT CLOCK signal chosen. Often the same delay may be obtained in a number of ways (e.g., by doubling both the number of units asserted and the frequency of the shift clock). Higher DELAY SHIFT CLOCK frequencies increase the resolution of discriminator 14.

Figure 4:
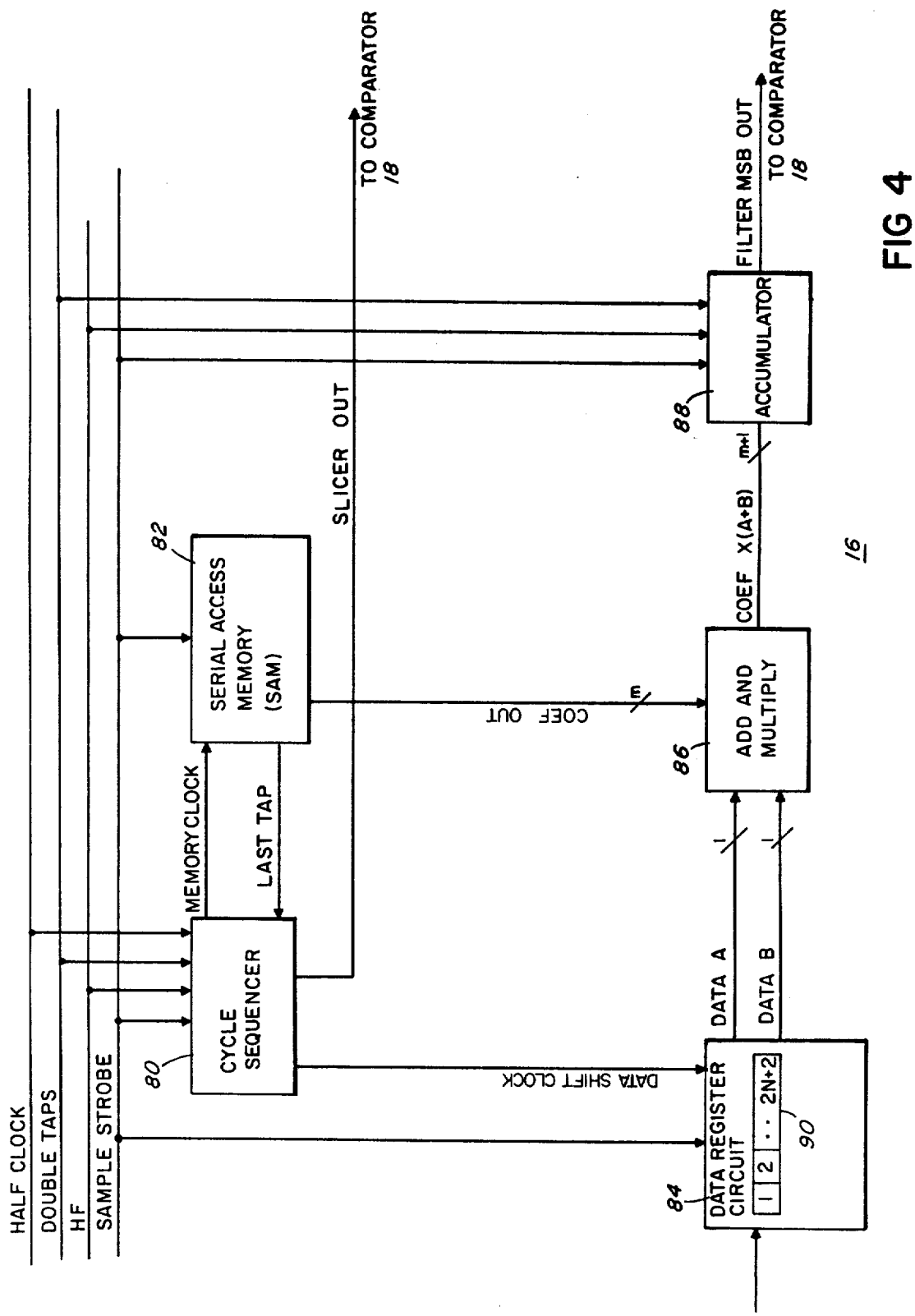
FIG. 4 is a block diagram of the low pass digital filter of the demodulator of FIG. 1.

Referring now to FIG. 4, filter 16 has a digital cycle sequencer 80, a coefficient serial access memory (SAM) 82, a data register circuit 84, an adder and multiplier 86, and an accumulator 88.

Filter 16 is a transversal, linear phase low pass digital filter. In any transversal digital filter an input waveform is sampled at regular intervals. Following the taking of each sample, a predetermined number of the most recent samples are each multiplied by the tap coefficients corresponding to their respective time slots, and the resulting products are summed to yield the filter output for the current sample.

Since filter 16 has a linear phase characteristic, its tap coefficients are symmetrical about the center. Thus only N tap coefficients need be stored, where 2N is the sample length of filter 16.

The N tap coefficients of filter 16 are stored in SAM 82. Circuit 84 samples and stores, on an internal delay line 90, the most recent 2N samples of the output of gate 24, hereafter referred to as $D_1, D_2, \ldots D_{2N}$, with $D_1$ being the most recent sample and $D_{2N}$ being the most ancient. (As will be discussed below, delay line 90 actually stores the 2N+2 most recent samples. However, only the 2N most recent samples are used for calculating the output of filter 16.)

When the SAMPLE STROBE signal goes active, circuit 84 samples, and enters onto delay line 90, as $D_1$, the then existing value of the output of gate 24. Simultaneous with the entry of the new sample, all previously existing samples are advanced one stage along delay line 90. Thus, the old $D_1$ becomes the current $D_2$, etc. The shifting of all samples one stage along delay line 90 is triggered by an active DATA SHIFT CLOCK signal, provided to delay line 90 by cycle sequencer 80.

After each entry of a new sample into stage $D_1$, cycle sequencer 80 cycles filter 16, by providing it with N active DATA SHIFT CLOCK signals. In response, circuit 84 provides sequentially, as output, DATA A, consisting of the samples $D_N$ to $D_1$, and DATA B, consisting of the samples $D_{N+1}$ to $D_{2N}$.

DATA A and DATA B are provided as input to adder and multiplier 86 which, for each pair $D_i$ and $D_{2N+1-i}$ (for i=N to 1) presented, computes the sum $(D_i+D_{2N+1-i})$. Since $D_1, D_2, \ldots D_{2N}$ can all have only the values of zero or one, the sum $(D_i+D_{2N+1-i})$, for each i, will be one of 3 decimal values: 0, 1 or 2.

At the same time that it provides circuit 84 with the N DATA SHIFT CLOCK signals (i.e., when filter 16 is being cycled), cycle sequencer 80 also provides N active MEMORY CLOCK signals to SAM 82, the N active DATA SHIFT CLOCK and MEMORY CLOCK signals being in phase with one another. In response to each active MEMORY CLOCK signal, SAM 82 provides, to adder and multiplier 86, as the signal COEF OUT, an M bit tap coefficient COEF(N), COEF(N−1), ... COEF(1).

Adder and multiplier 86 multiplies each (DATA A+DATA B)$_i$ (i.e., $(D_i+D_{2N+1-i})$) by its respective coefficient COEF(i), producing N output signals COEFF(i)×(DATA A+DATA B)$_i$ which are then provided as input to accumulator 88.

Accumulator 88 sums the N input signals to produce the output of filter 16, given by:

$$\text{FILTER OUT} = \sum_{i=1}^{N} \text{COEFF}(i) \times (D_i + D_{2N+1-i}).$$

where FILTER OUT is a binary number. The coefficients COEF(i), for i=1, 2 ... N, are scaled such that the decision of whether FILTER OUT exceeds a detection threshold can be accomplished merely by examining its most significant bit, FILTER MSB OUT.

Figure 5:
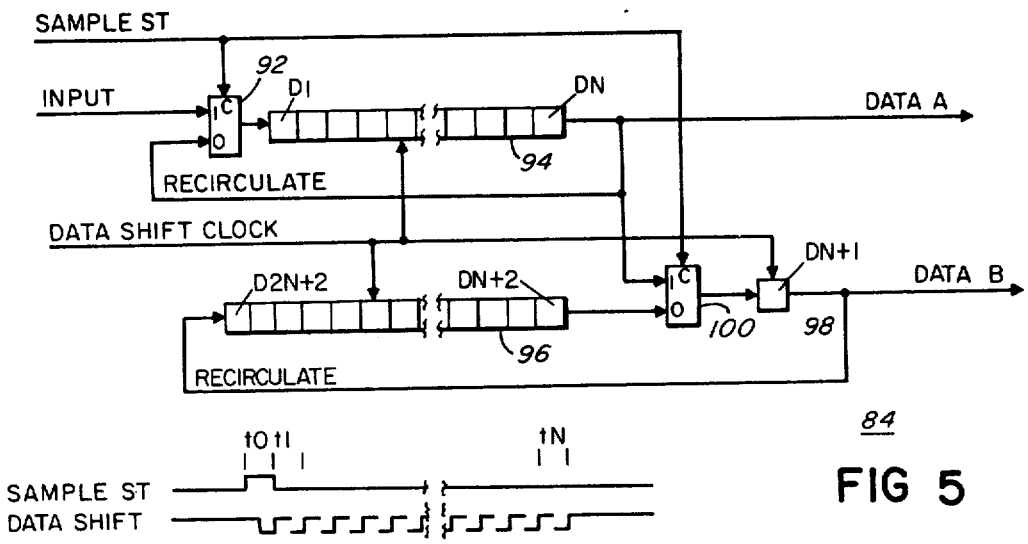
FIG. 5 is a schematic of an embodiment of the data registers circuit (including timing relationships) of the low pass digital filter of FIG. 4.

Details of one embodiment of circuit 84 are shown in FIG. 5, and include 1 of 2 multiplexers 92 and 100, an N stage unidirectional shift register 94, an N+1 stage unidirectional shift register 96, and a single stage unidirectional shift register 98.

When the SAMPLE STROBE signal goes active the DATA SHIFT CLOCK also goes active, multiplexer 92 gates the 1 bit value of the output of gate 24 into stage $D_1$ of shift register 94, and multiplexer 100 gates the 1 bit value of stage $D_N$ of shift register 94 into the single stage of shift register 98. The prior contents of shift register 98 are transferred to stage $D_{2N+2}$ of shift register 96 and all other values in shift registers 94 and 96 are shifted 1 stage right, with the value previously contained in stage $D_{N+2}$ of shift register 96 being lost.

During the N subsequent active DATA SHIFT CLOCK signals (when filter 16 is being cycled), signal DATA A will assume the values $D_N, D_{N-1}, \ldots D_1$, and signal DATA B will assume the values $D_{N+1}, D_{N+2}, \ldots D_{2N}$. During the N data shifts, the values in shift register 94 recirculate to their original register stages through multiplexer 92 but the values in shift registers 96 and 98 undergo a net displacement of 2 shifts left. Since there are a total of N+1 data shifts performed (i.e., 1 shift when a new sample is entered followed by N shifts when filter 16 is cycled) and a total of N+2 stages in registers 96 and 98, the net displacement of data in shift registers 96 and 98 is n+1 modulo n+2=−1. However, the net displacement of data in shift register 94, after N+1 data shifts is N+1 modulo N=+1. Therefore, for each cyclic operation where a new sample is taken in and filter 16 is then cycled, each sample in shift register 96 undergoes a net displacement of 1 stage forward, while each sample in shift registers 96 and 98 undergoes a net displacement of one stage backward.

The output of gates 22 and 24 is a square wave which exhibits a sin X/X amplitude vs. frequency characteristic. In cases where the modulation (i.e., baud) rate of the transmitted data is low enough and, consequently, the time interval between active SAMPLE STROBE signals is long enough, it may prove desirable to utilize more than 2N of the most recent samples of the output of gate 24. Doing so results in improved resolution of filter 16 as well as better rejection of the sin X/X frequency components.

Figure 6:
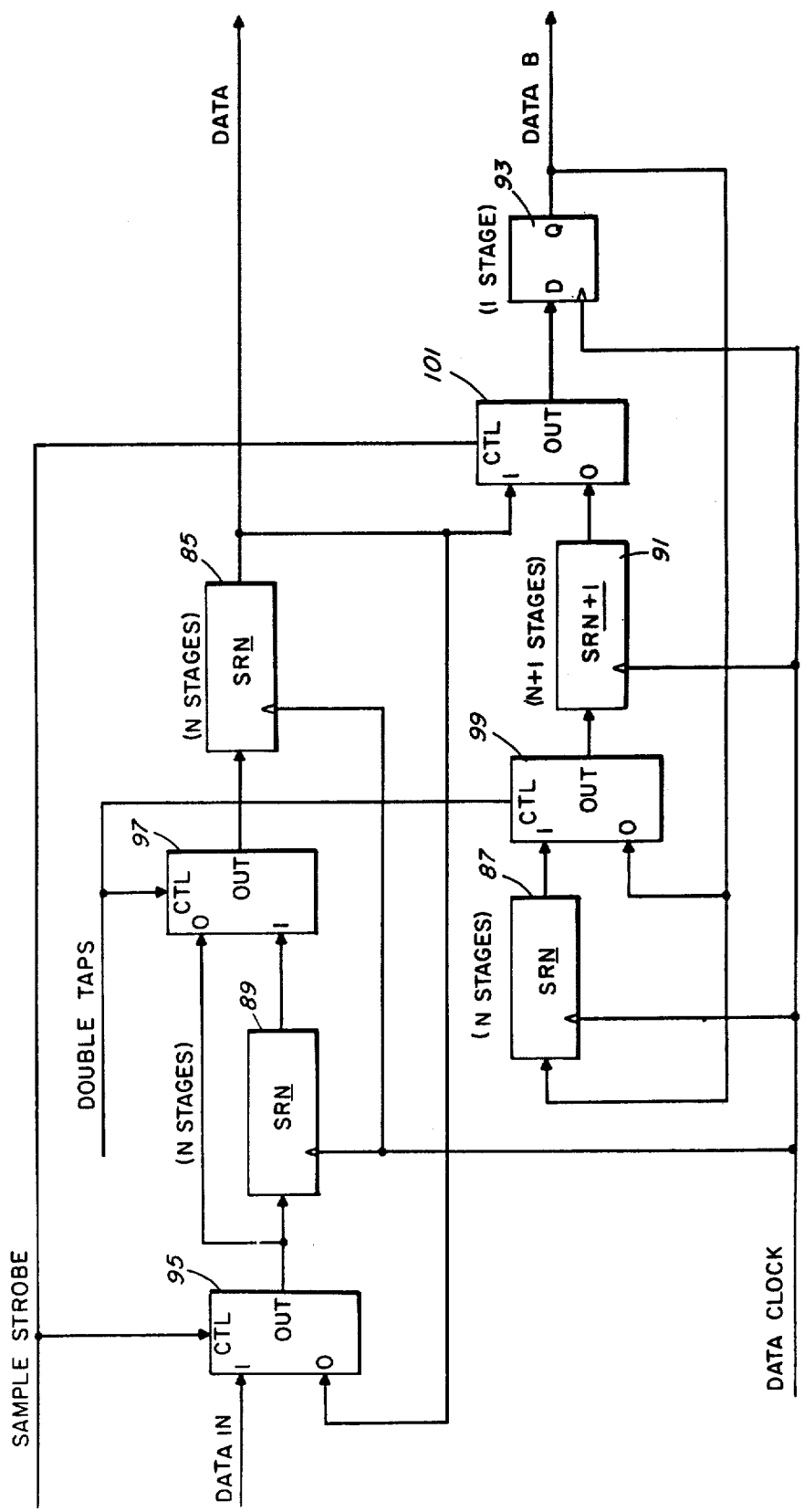
FIG. 6 is a schematic of another embodiment of the data registers circuit of the low pass digital filter of FIG. 4.

FIG. 6, to which we now turn, depicts an even more preferred embodiment of circuit 84, which allows filter 16 to utilize either the 2N or 4N most recent sample values of the output of gate 24.

Circuit 84' has N-stage unidirectional shift registers 85, 87 and 89; and N+1-stage unidirectional shift register 91; a 1-stage unidirectional shift register 93; and 1 of 2 multiplexers 95, 97, 99 and 101.

If the DOUBLE TAPS signal which controls multiplexers 97 and 99 is nonactive, then circuit 84' performs the same functions as circuit 84, with multiplexers 95 and 101 performing the same operations as multiplexers 92 and 100 and shift register 85, 91 and 93 performing the same operations as shift registers 94, 96 and 98, respectively. If, however, the DOUBLE TAPS signal is active, then multiplexers 97 and 99 include shift registers 87 and 89 within delay line 90 of FIG. 4.

For example, if the DOUBLE TAPS signal is active, the DATA IN signal which is presented to both shift register 89 and multiplexer 97 will not be able to pass directly through multiplexer 97 to shift register 85 but will instead only reach shift register 85 via the N stages of shift register 89. Similarly, when filter 16 is cycled with the DOUBLE TAPS signal active, samples passing through shift register 93 can reach shift register 91 only by passing sequentially through the N stages of shift register 87.

The net displacement undergone by samples in shift registers 87, 91 and 101, during the operation of shifting a new sample in followed by the cycling of filter 16, is $2N+1$ modulo $2N+2 = -1$. The net displacement of the samples in shift registers 85 and 89, during the same operation, is $2N+1$ modulo $2N = +1$. Thus, the same forward and backward movement is effected in both circuits 84 and 84'. However, use of circuit 84' provides the capability of obtaining increased resolution from filter 16.

Figure 7:
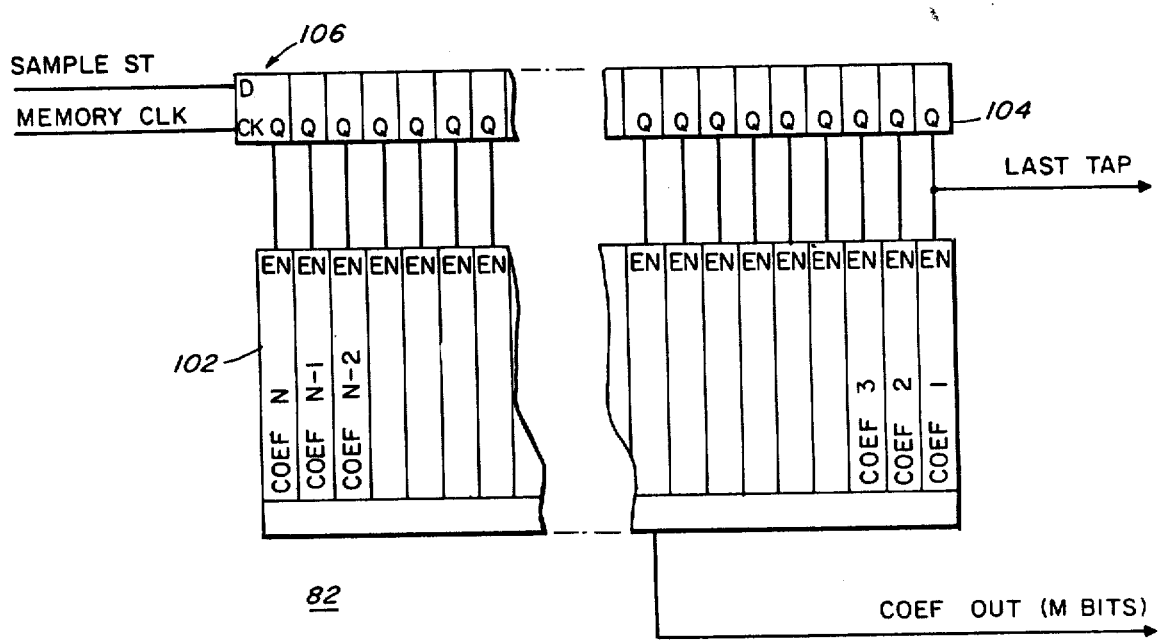
FIG. 7 is a schematic of the serial access memory (SAM) of the low pass digital filter of FIG. 4.

Referring now to FIG. 7, SAM 82 has an M bit by N word read only memory (ROM) 102 whose enable (or address) circuitry is connected to an N stage shift register 104. As discussed more fully below, the MEMORY CLOCK signal which clocks the shifting frequency of shift register 104, depending on the value of the DOUBLE TAPS SIGNAL, is selectable to the frequency of either the HF or the HALF CLOCK signal provided by timer 30.

When SAMPLE STROBE goes active, its value is applied as an input to a first stage 106 of shift register 104. Thereafter, the first active level of MEMORY CLOCK enables the Nth word COEF (N) of ROM 102, causing COEF OUT to assume the M bit value of COEF (N). Each successive active MEMORY CLOCK signal causes the SAMPLE STROBE value to move one stage to the right, enabling COEF (N−1) to COEF (1), successively. The enablement of COEF (1) also generates a LAST TAP signal which is sent to cycle sequencer 80, causing it to cease generating the DATA SHIFT CLOCK signal.

Figure 8:
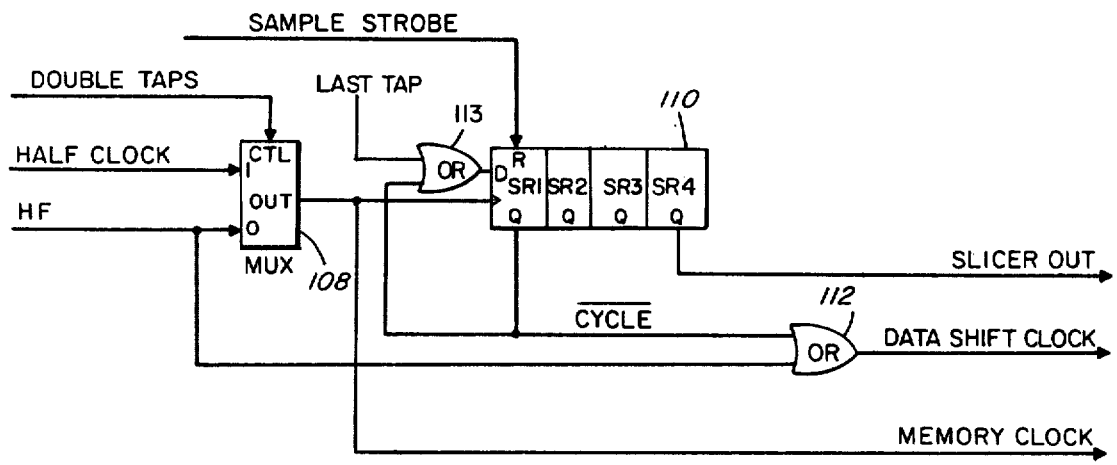
FIG. 8 is a schematic of the cycle sequencer (including timing relationships) of the low pass digital filter of FIG. 4.
Figure 8:
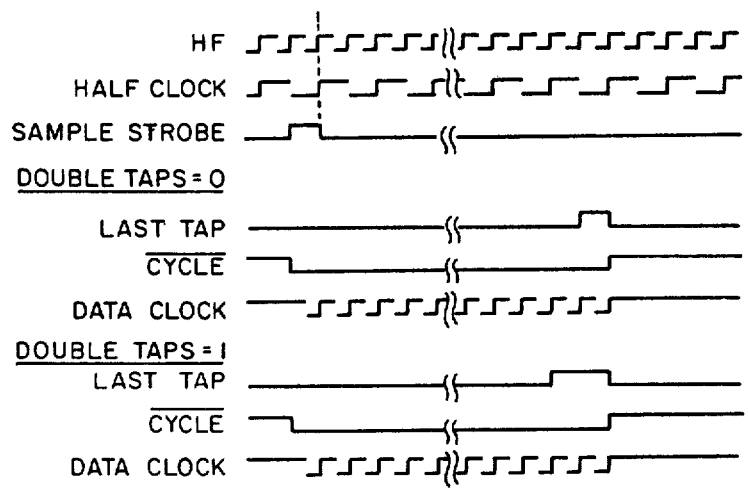

Referring now to FIG. 8, cycle sequencer 80 has a 1 of 2 multiplexer 108, a 4 stage shift register 110, and OR gates 112 and 113.

Multiplexer 108, depending upon the state of the DOUBLE TAPS control signal, selects the frequency of MEMORY CLOCK. If the DOUBLE TAPS signal is active, MEMORY CLOCK coincides with HALF CLOCK. Otherwise, it coincides with HF. The DATA SHIFT CLOCK, when it is active, always coincides with the HF signal. An active SAMPLE STROBE signal activates the DATA SHIFT CLOCK signal, while an active LAST TAP signal deactivates it. SLICER OUT is a signal which becomes active either 3 HF or 3 HALF CLOCK signals after LAST TAP goes active, depending on the state of the DOUBLE TAPS signal.

If demodulator 10 embodies circuit 84' of FIG. 6, then, following an active SAMPLE STROBE SIGNAL, if the DOUBLE TAPS signal is active, filter 16 will cycle, and 4N samples will be presented to adder and multiplier 86. DATA A will assume the values of $D_{2N}, D_{2N-1}, \ldots D_1$ and DATA B will assume the values of $D_{2N+1}, D_{2N+2}, \ldots D_{4N}$.

With the DOUBLE TAPS signal active, cycle sequencer 80 will generate the DATA SHIFT CLOCK signal equal to the HF signal and the MEMORY CLOCK signal to the HALF CLOCK signal. Thus, for each successive two pairs of DATA A and DATA B signals, adder and multiplier 86 will receive only 1 COEF OUT signal. As discussed below, this causes adder and multiplier 86 to form two separate products for each COEF OUT presented to it.

Figure 9:
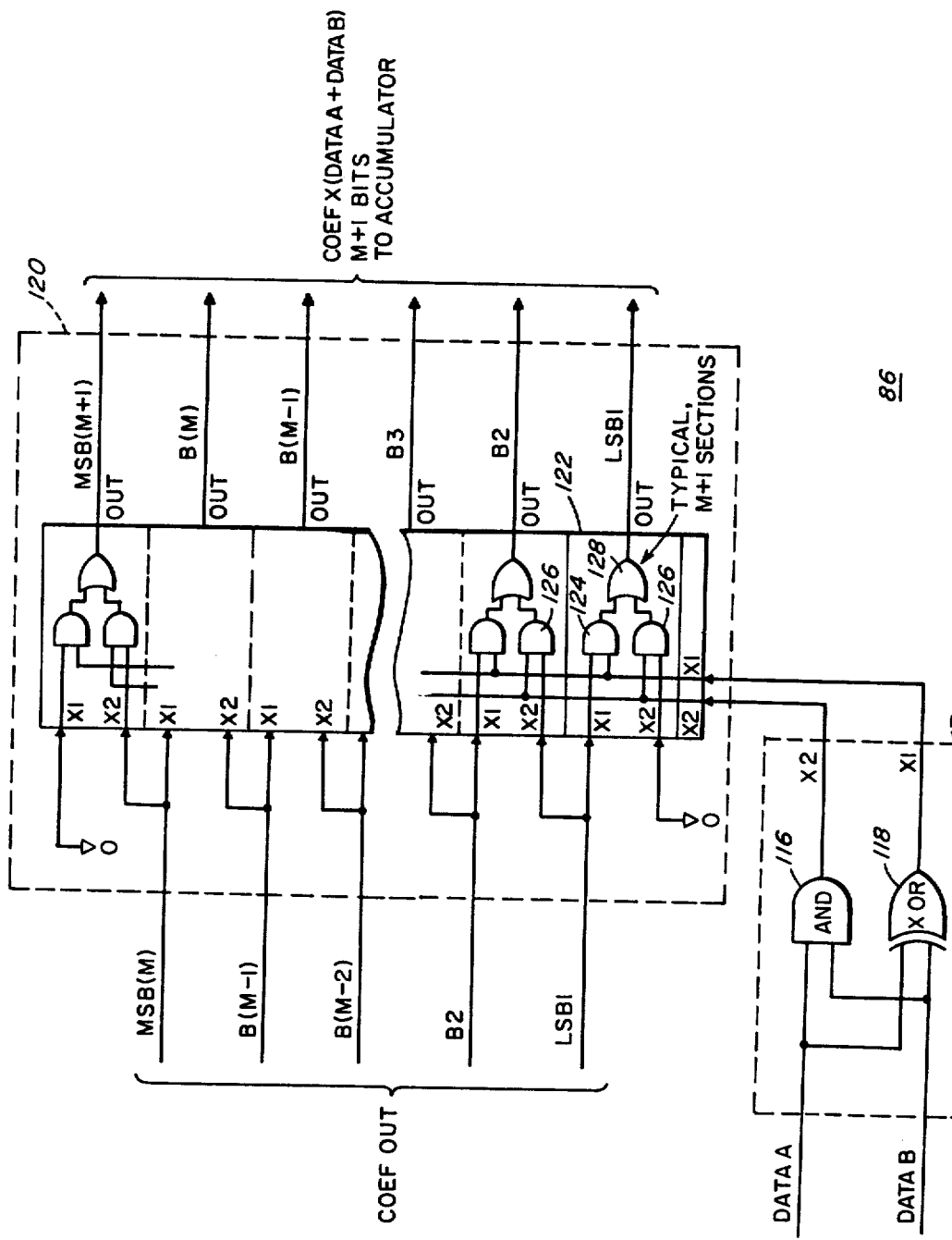
FIG. 9 is a schematic of the adder and multiplier of the low pass digital filter of FIG. 4.

Referring now to FIG. 9, adder and multiplier 86 has an adder circuit 114, consisting of an AND gate 116 and an EXCLUSIVE OR gate 118, interconnected as shown. Adder and multiplier 86 also has a multiplier circuit 120, consisting of M+1 subcircuits 122, where M is the bit length of the coefficients in SAM 82. (Each of subcircuits 122 has a rank from 1 to M+1. For purposes of discussion, the subcircuit 122 closest to the bottom of FIG. 9 is here assigned the rank 1, while the subcircuit 122 closest to the top of FIG. 9 is here assigned the rank M+1.) Each of subcircuits 122 consists of AND gates 124 and 126 and an OR gate 128.

During the N active pulses of DATA SHIFT CLOCK when filter 16 is cycling, if the DOUBLE TAPS signal is not active, DATA A and DATA B assume the successive values of $D_N, D_{N-1}, \ldots D_1$ and $D_{N+1}, D_{N+2} \ldots, D_{2N-1}$, respectively. If the sum of a pair of values (i.e., $D_i + D_{2N+1-i}$, for $i = N, N-1, \ldots 1$) is decimal 2, then signal X2 assumes the value 1. If this sum is decimal 1, then signal X1 assumes the value 1, and, if this sum is zero, both X1 and X2 remain 0. The structure of circuit 114 assures that X1 and X2 are never 1 simultaneously.

Signal X1 is provided as an input to each gate 124, and signal X2 is provided as an input to each gate 126. The other input to each of the M lowest gates 124 is one bit of the COEF OUT signal. The M+1st gate 124 is provided a 0 as its other input. Each of the M highest gates 126 has, as a second input, the same one bit of the COEF OUT signal which is input to gate 124 of the next lowest ranking subcircuit 122. The first gate 126 is provided with a 0 as its other input.

Whenever signals X1 and X2 are 0, then, regardless of the value of COEF OUT, all M+1 bits of the COEF×(DATA A+DATA B) signal will be 0. Whenever X1 is 1, then X2 will be 0 and COEF×(DATA A+DATA B) will differ from the binary value COEF OUT, only by the addition of a 0 in the M+1st bit place, i.e., it will be multiplied by a binary 1. If X2 is 1, then COEF×(DATA A+DATA B) corresponds to the signal formed by shifting each bit of COEF OUT one bit place towards the most significant bit MSB (M+1) and making the least significant bit LSB 1 assume the value 0. Such a shifting operation is equivalent to binary multiplication by 2.

If the DOUBLE TAPS signal is inactive, adder and multiplier 86 will generate N successive COEF×(DATA A+DATA B) signals, one for each COEF OUT signal presented. On the other hand, if the DOUBLE TAPS signal is active, adder and multiplier 86 will generate 2N successive COEF×(DATA A+DATA B) signals, by multiplying the value of each COEF OUT with the value of two successive (DATA A+DATA B) signals.

The N or 2N successive products pass to accumulator 88, to which we now turn.

Figure 10:
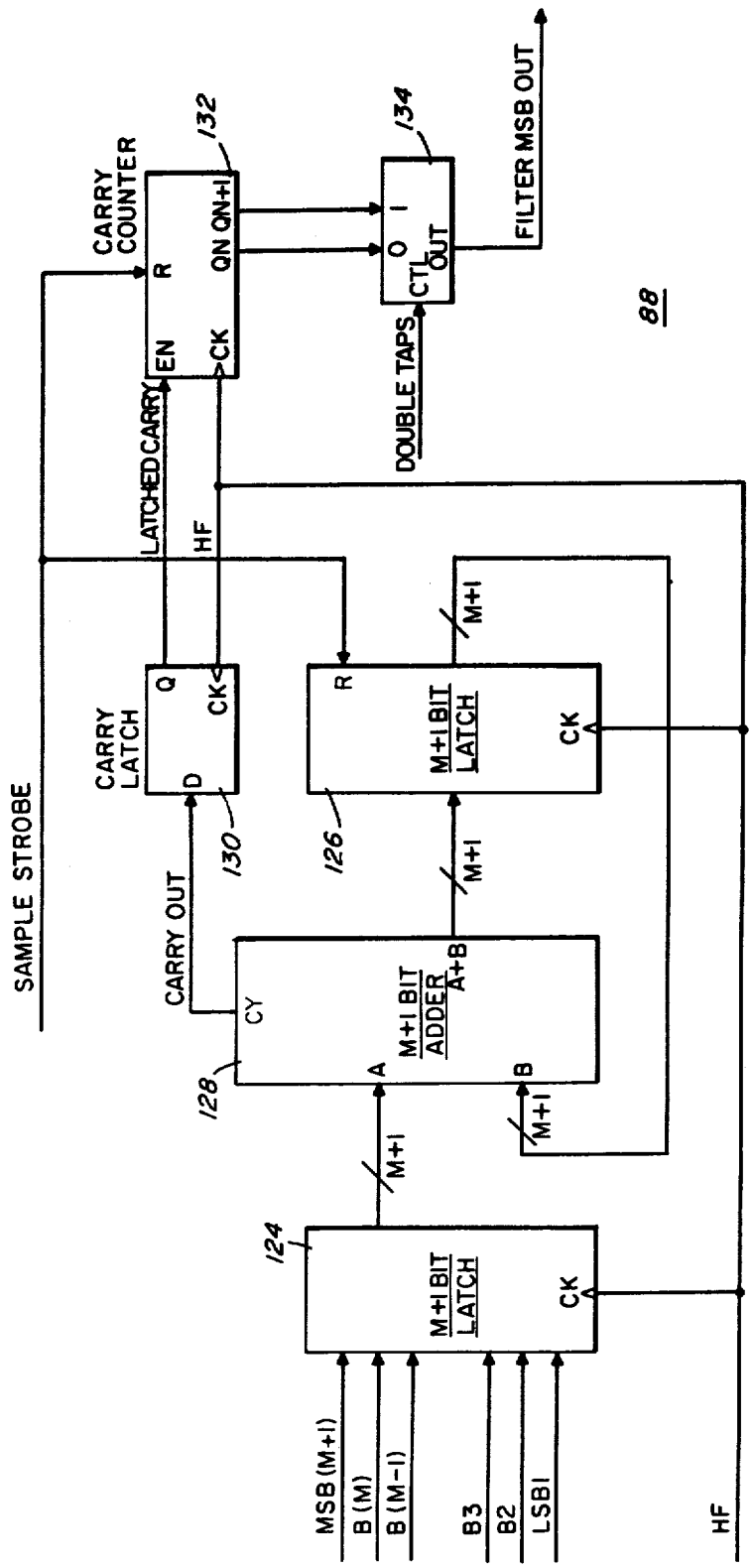
FIG. 10 is a schematic of the accumulator of the low pass digital filter of FIG. 4.

Referring now to FIG. 10, accumulator 88 has M+1 bit latches 124 and 126, an M+1 bit adder 128 (where M is the bit length of each COEF(i) in SAM 82), a 1 bit latch 130, a binary up-counter 132, and a 1 of 2 multiplexer 134.

An active SAMPLE STROBE signal resets the values contained in latch 126 to zero (i.e., M+1 binary 0's) and also zeroes counter 132. Thereafter, since HF coincides with the DATA SHIFT CLOCK signal during the cycling time of filter 16, each active HF signal will cause the values contained in latches 124 and 126 to be presented as input to adder 128. The output of adder 128 passes directly back to latch 126. Thus, following the first active HF signal during the cycling of filter 16, latch 126 will contain the value COEF×(DATA A+DATA B)$_1$, (the subscript 1 indicating this value to be the first of N or 2N such values). On the next active HF signal, COEF×(DATA A+DATA B)$_1$ and COEF×(DATA A+DATA B)$_2$ will be presented to adder 128. If this addition generates a carry (i.e., a 1 in the M+2nd bit place), a 1 will be stored in latch 130 and the remaining M+1 bits will be stored in latch 126. On yet the next succeeding active HF signal, any carry from a preceeding addition will cause counter 132 to increment by 1, while any carry generated by the current addition will be stored in latch 130.

After N+1 HF signals (or 2N+1 HF signals, if the DOUBLE TAPS signal is active) following SAMPLE STROBE signal, the numerical output of filter 16, FILTER OUT, will be the binary number consisting of the M+1 bit binary number residing in latch 126 preceeded by the number of carries generated during the accumulation, and the latter number will be the value contained in counter 132, representing the bits (i.e., 1's) of the accumulated sum greater than M+1.

Two taps at the Nth and N+1st stages of counter 132 provide signals $Q_N$ and $Q_{N+1}$ to multiplexer 134. Signals $Q_N$ and $Q_{N+1}$ are active whenever the number of carries generated during a cycling of filter 16 equals or exceeds $2^N$ or $2^{N+1}$, respectively. If the DOUBLE TAPS control signal is active, the FILTER MSB OUT signal corresponds to the $Q_{N+1}$ signal, while, if the DOUBLE TAPS signal is inactive, FILTER MSB OUT assumes the value of $Q_N$. Thus, for FILTER MSB OUT to be high (or 1), the number of carries which must be generated during the cycling of filter 16 when the DOUBLE TAPS signal is active, is twice the number of carries which must be generated when the DOUBLE TAPS signal is inactive.

The shape of the frequency response curve of filter 16 is determined by the relative magnitudes of the coefficients COEF(i), for i=1, 2, ... N contained in SAM 82, while the gain of filter 16 is determined by the absolute magnitudes of these coefficients. Therefore, the coefficients can be, and in present embodiments are, all multiplied by a common scaling factor S, without altering the shape of filter 16's frequency response curve.

The embodiment of demodulator 10 presented here detects 2 level FSK communications signals, where a decision must be made as to whether the recovered baseband signal is above or below a threshold value, typically half of its maximum value. To accomplish this, the coefficients COEF(i) are all scaled such that:

$$\sum_{\text{all } i} 2 \times COEF(i) = 2^{N+1} - 2,$$

where N is an integer.

The summation above is the maximum output of filter 16. Half of the maximum output of filter 16 is then given by the number $2^N-1$. The Nth and N+1st stages of counter 132 provides signals $Q_N$ and $Q_{N+1}$ to multiplexer 134. In the mode of operation where the DOUBLE TAPS signal is inactive, if if $Q_N$ is 1, then the threshold has been exceeded, whereas, if it is a 0, the threshold has not been exceeded. If the DOUBLE TAPS SIGNAL is active, the N+1st stage of counter 132 is used to determine whether the threshold has been exceeded, since, in this case, the maximum output of filter 167 (and therefore the threshold) is double that of the previous case.

Although the embodiment presented here is directed to two-level modulation, this concept is extendable to higher level modulation schemes. For the case of four-level modulation, two stages of counter 132 would be used with the two most significant bits indicating the detection threshold decision, etc.

The FILTER MSB OUT signal is provided as input to comparator 18, to which we now turn.

Figure 11:
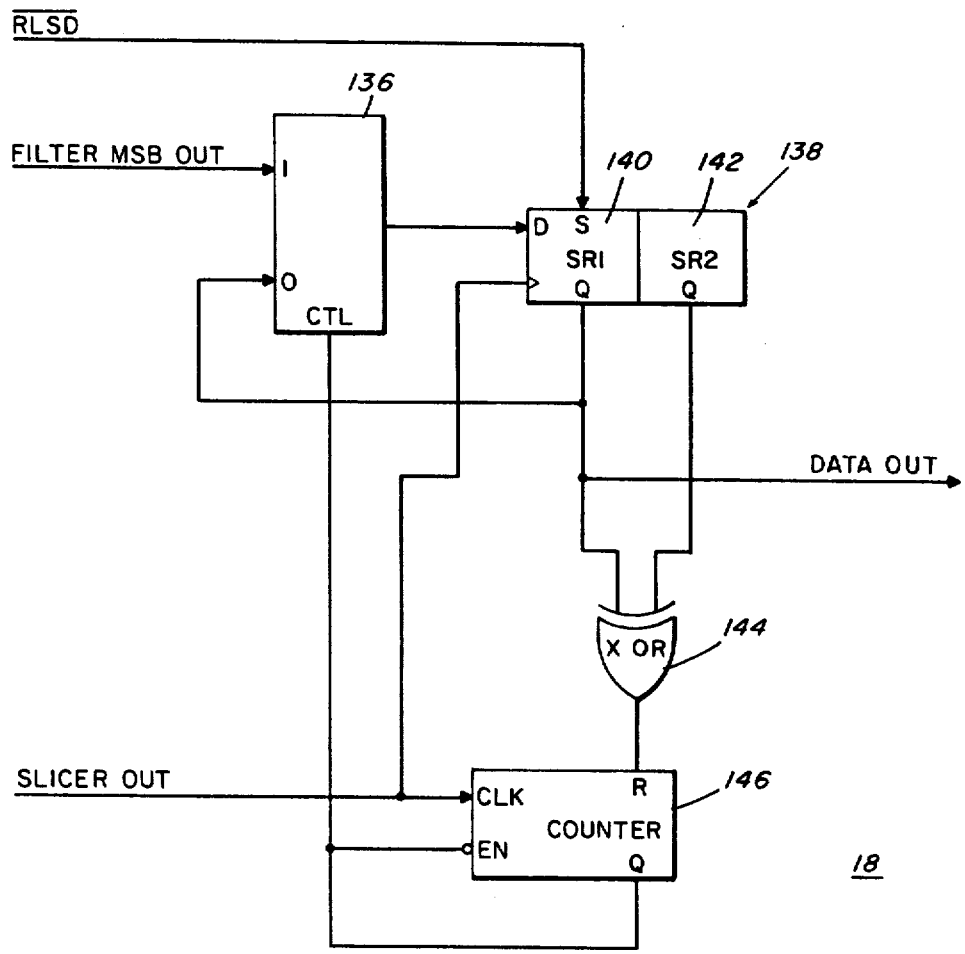
FIG. 11 is a schematic of the digital comparator of the demodulator of FIG. 1.

Referring now to FIG. 11, comparator 18 has a 1 of 2 multiplexer 136, a 2 stage shift register 138 having a first stage 140 and a second stage 142, an EXCLUSIVE OR gate 144, and a binary counter 146.

By reference to FIG. 8, it will be seen that the active edge of the SLICER OUT signal, which serves as a clock to shift register 138 and counter 142, is of the same frequency as, but delayed 3 MEMORY CLOCK periods behind, the LAST TAP signal. Each active SLICER OUT signal causes counter 146 to increment by one and also causes shift register 38 to perform a shifting operation, wherein the contents of stage 140 are simultaneously transferred to stage 142 and also presented as one of the two inputs to multiplexer 136 and also causes the output of multiplexer 136 to be entered into stage 140 as the new DATA OUT signal at the end of each filter cycle.

The provision of gate 144 prevents the occurance of multiple edges on data output transitions. If there is a transition between two successive filter cycles (e.g., FILTER MSB OUT changes from 0 to 1), counter 146 is reset to zero and further transitions of the DATA OUT signal are inhibited for a predetermined number of filter cycles as follows. If the value contained in counter 146 has not reached a predetermined value Q, multiplexer 136 does not transfer the FILTER MSB OUT signal but, instead, keeps recirculating the contents of stage 140, whose value represents the state to which the DATA OUT signal transitioned prior to being inhibited. When the value contained in counter 146 reaches a predetermined value, indicating a sufficient number of filter cycles have elapsed, the Q signal from counter 146 causes multiplexer 136 to again present the FILTER MSB OUT signal to stage 140.

The received line signal detect (RSLD), which may be generated by conventional modem carrier detect circuitry, indicates the presence of an incoming data communication. In its absence, stage 140 provides a stream of 1's as the DATA OUT signal.

Other embodiments are within the following claims. For example, as discussed above, after proper scaling of the tap coefficients, the decision as to whether a threshold has been exceeded need not be based on only the most significant bit of the computed filter output. In four level modulation systems the two most significant bits of the filter output are examined, etc.

Specific aspects of the programmable digital discriminator and the digital filter with programmable bandwidth were the joint invention of William D. Northam and C. Kenneth Miller, conceived after my invention claimed herein.

Specific aspects of the digital filter register architecture, including the selectably increased resolution, were the invention of William D. Northam, conceived after my invention claimed herein.

I claim:

1. Modem circuitry for processing signals representing digital data, comprising sampling means for providing a stream of samples of said signals, storage means connected to receive from said sampling means and to store a set of said samples, arithmetic means responsive to said storage means and connected to multiply each said sample by a tap coefficient drawn from a set of scaled tap coefficients and to add the resulting products to form a multiple-bit value, and comparator means responsive to said arithmetic means and connected to compare a predetermined group of the bits of said multiple-bit value with a threshold value to produce an output signal, said group being selected from a set consisting of fewer than all the bits in said multiple-bit value.

2. The modem circuitry of claim 1 wherein said set excludes at least one of the least significant bits of said multiple-bit value.

3. The modem circuitry of claim 1 wherein said set excludes all but the most significant bit of said multiple-bit value.

4. The modem circuitry of claim 1 wherein the value of the bits in said set and the threshold value are both powers of two.

5. The modem circuitry of claim 1 wherein there are N said scaled tap coefficients, where N is an integer and said coefficients satisfy the equation $$\sum_{\text{all } i} 2 \times \text{coefficient}(i) = 2^{N+1} - 2$$

* * * * *